United States Patent
Chen et al.

(10) Patent No.: US 6,841,311 B1
(45) Date of Patent: Jan. 11, 2005

(54) CLEANING PROCESS FOR PHASE SHIFT MASKS

(75) Inventors: Same-Ting Chen, Hsinchu (TW); Cheng-Shien Lee, Hsinchu (TW); Chin-Wang Hu, Jubei (TW); Chieh-Yuan Cheng, Taipei (TW); Hsiang-Chien Hsu, Taipei (TW); Tzy-Ying Lin, Hsinchu (TW); Wen-Rong Huang, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 508 days.

(21) Appl. No.: 10/099,029

(22) Filed: Mar. 15, 2002

(51) Int. Cl.$^7$ .......................... H01L 21/00; G03F 9/00
(52) U.S. Cl. .................. 430/5; 134/3; 134/2; 510/175
(58) Field of Search ................. 510/175, 176, 510/177; 134/2, 3; 430/5

(56) References Cited

U.S. PATENT DOCUMENTS

| 5,152,878 A | 10/1992 | Datta et al. ............... 204/141.5 |
|---|---|---|
| 5,439,763 A * | 8/1995 | Shimase et al. ................ 430/5 |
| 5,547,516 A | 8/1996 | Luch ........................... 136/244 |
| 5,578,273 A | 11/1996 | Hanson et al. ............... 422/110 |
| 5,679,483 A * | 10/1997 | Maurer .......................... 430/5 |
| 6,723,477 B2 * | 4/2004 | Nozawa et al. ................ 430/5 |
| 6,743,553 B2 * | 6/2004 | Shiota et al. .................. 430/5 |

FOREIGN PATENT DOCUMENTS

| TW | 508642 A * | 11/2002 | ........... H01L/21/00 |

* cited by examiner

Primary Examiner—Gregory Webb
(74) Attorney, Agent, or Firm—Thomas, Kayden, Horstemeyer & Risley

(57) ABSTRACT

A new sequence and chemical composition for cleaning the surface of a halftone shift masks that use MoSiON as shifter material is provided. For purposes of repair or rework, the pellicle is removed from the mask so that the mask can be accessed. After the rework or repair has been completed, a new clean process is performed, for the new clean process the sequence of steps that is conventionally performed has been modified. After the new clean process has been completed, the pellicle is reinstalled over the surface of the mask.

33 Claims, 2 Drawing Sheets

FIG. 1 — Prior Art

CLEANING PROCESS FOR PHASE SHIFT MASKS

BACKGROUND OF THE INVENTION (1) Field of the Invention

The invention relates to the fabrication of integrated circuit devices, and more particularly, to a new method for cleaning phase shifting masks.

(2) Description of the Prior Art

Photomasks, which are a key component in the performance of photolithographic exposures, are used repeatedly and cyclically during the process of creating semiconductor devices. A photomask contains patterns that are projected from the mask to underlying layers of semiconductor material, such as a layer of photoresist. The standard mask comprises a transparent substrate on the surface of which a patterned layer of opaque material has been created. Typically used for the opaque material is chromium that has been deposited over the quartz substrate to a thickness of about 1,000 Angstrom. Alternate opaque materials for the creation of the patterned layer on the surface of a photolithographic mask are nickel and aluminum while for more sophisticated masks such as halftone phase shift masks MoSiON is used as the phase shifter material. For the substrate most typically is used quartz whereby however glass and sapphire can also be used for this purpose. Phase shift masks apply the principle of phase shifting of the light as the light passes through the mask. Phase shift masks are used for the creation of device features of sub-micron dimensions, where projected light that is in extreme close proximity mutually influences adjacent light, having a detrimental effect on the formation of the exposed patter. A further level of sophistication is introduced by the use of regions on the surface of the substrate of the photomask that pass light in a graded manner, the so-called Gray-Tone Masks (GTM). Light passing characteristics of the GTM mask can be adjusted so that not only complete passing or complete blocking of light takes place but so that the mask provides a graded exposure that may for instance be if use in creating dual damascene structures, where depth of light exposure can be used for non-uniform removal of a layer of photoresist over the thickness of the layer of photoresist.

Due to the nature of the repeated and cyclical use of a photomask, residue of semiconductor materials such as metal and the like frequently accumulates on the surface of the mask. The mask must therefore, after the mask has been used for a certain number of photolithographic exposures, be cleaned in order to remove the accumulated deposits which otherwise interfere with and inhibit the desired performance of the mask. The mask is therefore removed from the exposure tool and typically chemically cleaned.

The phase shift mask provides a solution to the problems that are associated with creating devices features of sub-micron dimensions, which pose one of the most challenging aspects of photolithographic exposures of semiconductor surfaces with the objective of creating patterns therein. A typical halftone phase shift mask uses a patterned and etched layer of MoSiON as the phase shifter. The pattern of MoSiON is known to have good phase shifter characteristics but as a disadvantage of MoSiON must be cited that MoSiON is very sensitive to chemical cleaning. This requires that an optimum process is provided for cleaning the surface of a halftone phase shift mask that uses a patterned and etched layer of MoSiON as the phase shifter. The invention provides such a process, which is particularly adapted to taking into consideration effects of pellicle removal and the removal of residues that remain on the surface of the mask after the pellicle removal has been completed.

U.S. Pat. No. 5,152,878 (Datta et al.) shows an electrochemical mask cleaning process.

U.S. Pat. No. 5,578,273 (Hanson et al.) and U.S. Pat. No. 5,472,516 (Lunch) reveal related SC1 cleaning processes for photomasks.

SUMMARY OF THE INVENTION

A principle objective of the invention is to provide a method for cleaning the surface of halftone shift masks that use MoSiON as shifter material.

Another objective of the invention is to provide a method for cleaning the surface of halftone shift masks that use MoSiON as shifter material such that interaction between glue residue, which remains on the surface of the mask after removal of the pellicle of the mask, and the MoSiON of the phase shifter is eliminated.

In accordance with the objectives of the invention a new sequence and chemical composition for cleaning the surface of a halftone shift masks that use MoSiON as shifter material is provided. For purposes of repair or rework, the pellicle is removed from the mask so that the mask can be accessed. After the rework or repair has been completed, a new clean process is performed, for the new clean process the sequence of steps that is conventionally performed has been modified. After the new clean process has been completed, the pellicle is reinstalled over the surface of the mask.

DESCRIPTION OF THE PREFERRED EMBODIMENTS

Figure 1:
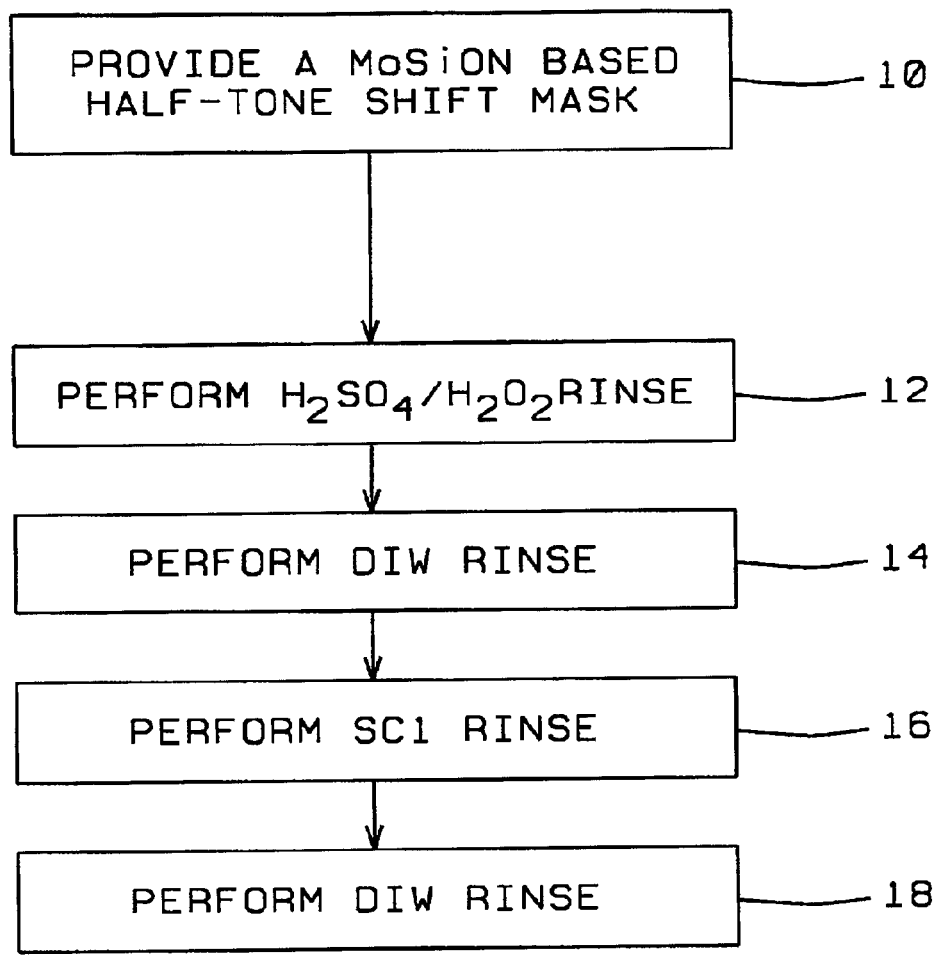
FIG. 1 shows a flow diagram of the conventional cleaning process of cleaning the surface of a photomask that uses MoSiON as phase shifter material.

A pellicle is typically applied over the surface of the patterned layer of MoSiON. Conventionally, a pellicle is a thin skin or membrane, which has found a number of applications such as forming a partially reflecting thin membrane that is used in cameras for color photography to divide a light beam and to form two optical images of a single subject. In a halftone phase shift mask, a pellicle is used to further improve and fine-tune phase shifting characteristics of the mask, this be forming the pellicle as a thin, transparent film over the patterned and etch layer of MoSiON.

The process of the invention, which addresses the cleaning of the surface of a halftone shift mask, which use MoSiON as shifter material, is a subset of the cycle of repairing and/or reworking a half tone mask. At the time that it is decided that a halftone shift mask, which use MoSiON as shifter material, must be repaired or reworked, the following sequence of steps takes place:

1. the pellicle is removed from the surface of the mask so that the surface of the mask, typically the patterned and etched layer of MoSiON, can be accessed for repair or rework
2. the repair or rework process is performed and completed
3. the pellicle is re-applied over the surface of the mask, that is over the surface of the repaired or reworked pattern of MoSiON.

The disadvantage of this process is that glue residue of the glue that has been used to attach the pellicle to the surface of the half tone mask is difficult to remove. This glue residue will interfere with the pattern of MoSiON, degrading the performance of the half tone mask. Additional cleaning of the surface does not result in additional removal of the glue residue. A process which resolves the issue of removing glue residue, is therefore required. The invention provides this process.

To further explain the invention, the conventional process of cleaning the surface of a halftone mask is first highlighted. It must thereby be remembered that this cleaning process is performed after the pellicle has been removed from the surface of the MoSiON based half tone mask, this is also referred to as the half tone mask has been de-mounted.

The current clean cycle is as follows:
apply a mixture of $H_2O_2$ and $H_2SO_4$ to the surface of the de-mounted MoSiON based half tone mask
apply a DIW rinse to the surface of the de-mounted MoSiON based half tone mask
apply SC1, which is, for conventional processing, a mixture of $H_2O_2$ and $NH_4OH$ and $H_2O$, to the surface of the de-mounted MoSiON based half tone mask
apply a DIW rinse to the surface of the de-mounted MoSiON based half tone mask.

It must with respect to the above detailed current clean cycle be emphasized that the invention provides for a different mixture for the SC1 rinse. This different mixture will be detailed at a later time.

The disadvantage of this processing cycle is that, as has previously been highlighted, glue residue remains in place over the surface of the patterned phase shifter material of MoSiON after the pellicle has been de-mounted from the surface of the half tone mask. This is essentially due to the fact that MoSiON is used for the phase shifter material since MoSiON is very sensitive to chemical interaction with cleaning components. Additional cleaning does not remove the glue residue. This glue residue is typical of MoSiON based half tone masks and is not present in conventional chromium/chromium oxide based binary masks. It is therefore reasonable to conclude that the glue has a stronger chemical bond with MoSiON than with chromium and chromium oxide.

To avoid confusion it must be pointed out at this time that a step of what is referred to as SC1 dipping is performed during cleaning the surface of the de-mounted mask. SC1 dipping is dipping of the de-mounted mask in a chemical mixture, the invention provides a new recipe for this mixture, the old and the new recipe will at this time be highlighted, as follows:
1. the old SC1 mixture is a mixture of $H_2O_2$ and $NH_4OH$
2. the new SC1 mixture is a mixture of $H_2O$ and $NH_3$ and $H_2O_2$ The suggested mechanism of this stronger bond is explained as follows:
1. after contact of the surface of the half tone mask with water, the glue starts to cross link and becomes an adhesive material having a high molecular weight, that is $(RCOOR)_x$, an acrylate ester polymer
2. by exposing the surface to a mixture of $H_2SO_4$ and $H_2O_2$ and $H_2O$, the $(RCOOR)_x$ is hydrolized and becomes a colloid $(RCOOH)_x$ that flows easily but that cannot be completely dissolved
3. the $(RCOOH)_x$ flows into the phase shifter area and enters into a chemical reaction with the N atom of the contacted MoSiON, forming a non-removable contaminant.

The solution provided by the invention is a SC1 based mechanism, as follows:
under basic conditions of SC1, which is a mixture of $NH_3$ and $H_2O$ and $H_2O_2$, the acrylate ester polymer $(RCOOR)_x$ is also hydrolized but converts into a water-soluble salt solution $(RCOO—NH_{4+})_x$
the introduced reaction of the invention is: $(RCOOR)_x + NH_3/H_2O+H_2O_2 — (RCOOH)_x — (RCOO—NH_{4+})_x$.

The new process is:
SC1 dipping, using a new SC1 mixture of the invention, for a time of about 2 minutes
water rinse
normal clean process.

It is of value to briefly review the difference between a standard binary photomask and a phase shift mask that is addressed by the invention.

A conventional binary photomask has a opaque pattern that is formed on the surface of what is typically a quartz substrate. The opaque pattern conventionally comprises chromium, a layer of chromium oxide is formed over the surface of the patterned chromium. The thickness of the combined layers of chromium and chromium oxide is larger than the thickness of a typical opaque pattern that is formed on a phase shift mask.

The phase shift mask that is addressed by the invention has a opaque pattern that is formed on the surface of what is typically a quartz substrate. The opaque pattern comprises MoSiON, this pattern forms the main pattern of the mask and is essentially created over a surface area of the substrate that does not include the perimeter of the mask. For the perimeter of the mask, a pattern comprising chromium is formed over the surface of the quartz substrate.

A series of three tests will next be described that comprise the following three sequences of steps of cleaning of the surface of a photo mask:
1. the first test uses a halftone phase shift mask with MoSiON as the phase shifter material; the pellicle is glued to the main pattern of the mask which implies that the perimeter of the mask is exposed and is not covered by the pellicle; a conventional clean cycle is applied to the surface of the mask
2. the second test uses the same halftone mask as is used for test #1, the surface of this mask is cleaned by performing additional steps of pre-clean which are performed prior to the conventional clean cycle of the surface of the mask
3. the third test uses a conventional binary photo mask, having as previously highlighted Cr/CrO as the opaque pattern over the surface of a quartz substrate, the entire surface of the mask is covered with the pellicle; the surface of this mask is cleaned by performing the same step of surface clean as have been performed for test #2 above, that is additional steps of pre-clean which are performed prior to the conventional clean cycle of the surface of the mask.

The specific steps of surface clean that are performed for the three tests that have been detailed above Are the following:
test #1:
1. a rinse with a mixture of $H_2SO_4$ and $H_2O_2$
2. a rinse with DI water
3. a rinse with SC1, which is a mixture of $H_2O_2$ and $NH_4OH$ and $H_2O$
4. a rinse with DI water.
test #2:
1. (new step of) a rinse with SC1, which is a new SC1 mixture of $H_2O$ and $NH_3$ and $H_2O_2$ 2. (new step of) a rinse with DI water
3. the remaining steps are the same as the four steps that been highlighted above for test #1.
   test #3:
1. all of the clean steps are the same as have been highlighted above for test #2.

The photomask surface has been examined after each of this series of test has been completed, the following results have been observed:
   test #1 showed glue contamination
   test #2 showed no glue contamination
   test #3 showed no glue contamination.

Since the surface that have been used for tests #1 and #2 were the same surface and since the procedure that has been performed under test #1 and test #2 differ by the two (new) steps of a rinse with SC1 and a rinse with DI water, it is reasonable to conclude that this difference in applied clean steps is the cause for the elimination of the glue contamination (the result observed after the first test) and no glue contamination (the result observed after the second test).

The latter can be stated as follows: by adding the steps of a new SC1 clean and DI water clean before the conventional steps of clean of the halftone phase shift mask with MoSiON as the phase shifter material, the glue contamination is removed from the surface of the mask. The mechanism which explains this process has previously been presented.

Figure 2:
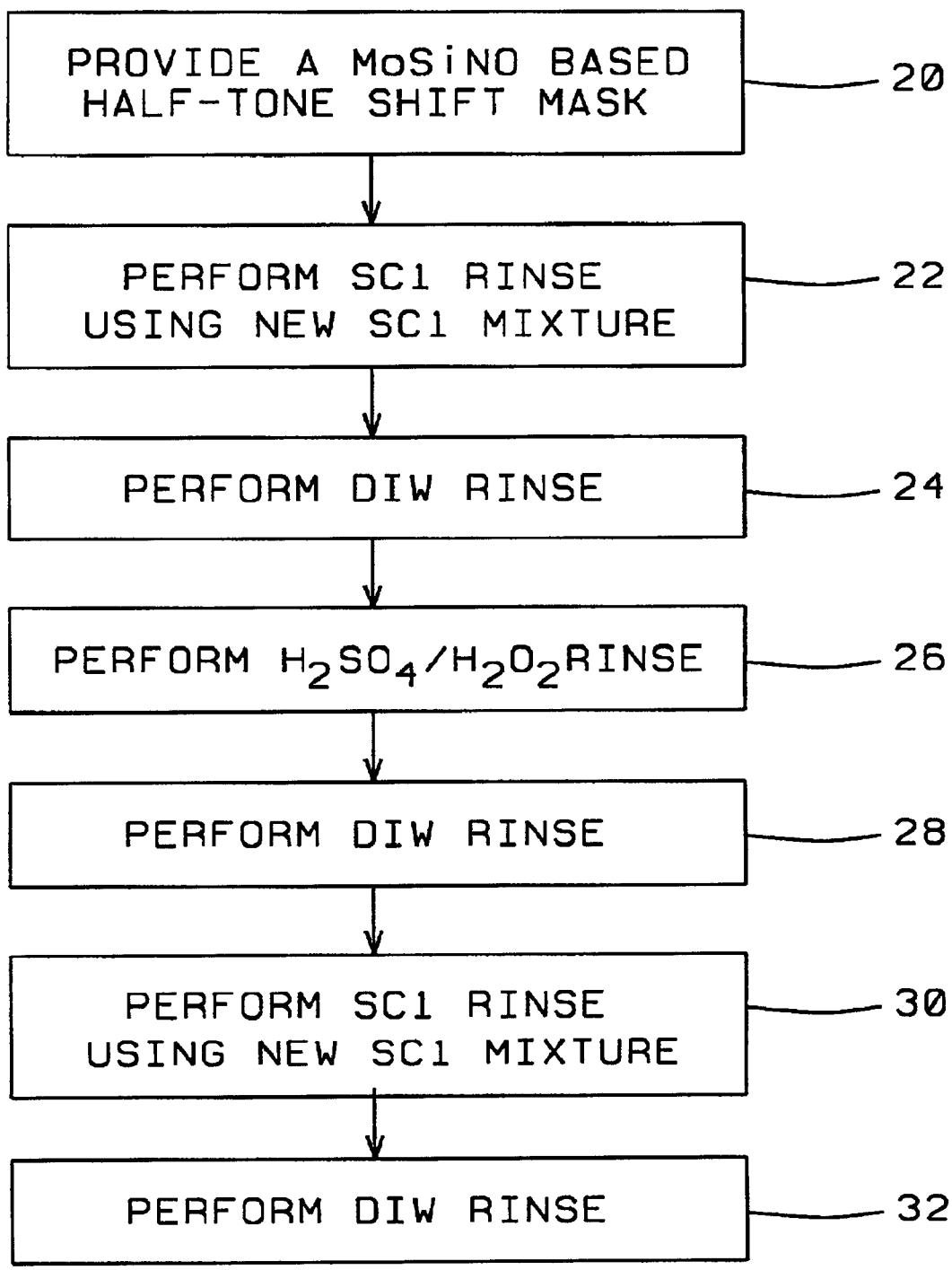
FIG. 2 shows a flow diagram of the cleaning process of the invention for cleaning the surface of a photomask that uses MoSiON as phase shifter material.

To make the difference between conventional cleaning of the surface of a MoSiON based halftone phase shift mask, the conventional method of cleaning this mask and the method of the invention are summarized using the flow charts of FIGS. 1 and 2 wherein FIG. 1 shows the conventional cleaning process and FIG. 2 shows the cleaning process that is provided by the invention.

Referring now specifically to the flow diagram that is shown in FIG. 1, the following step of surface clean of a MoSiON based halftone phase shift mask have been highlighted as the conventional clean steps:
   step 10, provide a MoSiON based halftone phase shift mask
   step 12, apply a $H_2SO_4/H_2O_2$ rinse to the surface of the mask
   step 14, perform a DIW rinse of the surface of the mask
   step 16, apply a SC1 rinse to the surface of the mask; the SC1 mixture is a mixture of $H_2O/NH_3/H_2O_2$ or $H_2O/NH_4OH/H_2O_2$, and
   step 18, perform a DIW rinse of the surface of the mask.

FIG. 2 summarizes the step of surface clean of the invention of a MoSiON based halftone phase shift mask, as follows:
   step 20, provide a MoSiON based halftone phase shift mask
   step 22, apply a new first SC1 rinse to the surface of the mask; the SC1 rinse is a rinse with a mixture of $H_2O/NH_3/H_2O_2$ or $H_2O/NH_4OH/H_2O_2$
   step 24, perform a DIW rinse of the surface of the mask
   step 26, apply a $H_2SO_4/H_2O_2$ rinse to the surface of the mask
   step 28, perform a DIW rinse of the surface of the mask
   step 30, apply a conventional second SC1 rinse to the surface of the mask; the SC1 rinse is a rinse with a mixture of $H_2O/NH_3/H_2O_2$ or $H_2O/NH_4OH/H_2O_2$, and
   step 32, perform a DIW rinse of the surface of the mask.

To summarize the invention:
   the invention has provided a new rinse sequence for the clean of the surface of a MoSiON based halftone phase shift mask by adding two steps of clean before the conventional steps of surface clean, and
   the invention has provided a new SC1 mixture for the first SC1 rinse of the surface of the half tone mask.

Specific processing conditions of the invention for cleaning the surface of a phase shift mask can be summarized as follows:
   a Phase Shift Mask (PSM) is provided, the PSM having been provided with a pattern of phase shifter material over a second surface of the PSM, a pellicle having been provided over the surface of the pattern of phase shifter material;
   the pellicle is removed from the surface of the pattern of phase shifter material
   a first SC1 rinse is applied to the surface of the mask
   a first DIW rinse of the surface of the mask is performed
   a $H_2SO_4/H_2O_2$ rinse is applied to the surface of the mask
   a second DIW rinse of the surface of the mask is performed
   a second SC1 rinse is applied to the surface of the mask, and
   a second DIW rinse of the surface of the mask is performed.

For the above indicated processing steps, the first SC1 rinse can be performed selecting a mixture from the group of mixtures consisting of a mixture of $H_2O/NH_3/H_2O_2$ and $H_2O/NH_4OH/H_2O_2$.

Furthermore, the second SC1 rinse may apply the same mixture as the first SC1 rinse. From this follows that the mixture of the first SC1 rinse and mixture of the second SC1 rinse can be selected from the above highlighted group of mixtures.

The mixture of $H_2O$ and $NH_3$ and $H_2O_2$ being in a volume ratio of $H_2O:NH_3:H_2O_2=1:x:y$, whereby the value of x varies between a numeric value of 1 and 0 while y varies between a numeric value of 0 and 1.

The mixture of $H_2O_2$ and $NH_4OH$ being in a volume ratio of $H_2O_2\ NH_4OH=x:1$, whereby the value of x varies between a numeric value of about 1 and 50.

The results of the new clean process of the invention is that glue residue is effectively removed from the surface of the MoSiON based halftone phase shift mask.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:
1. A method for cleaning the surface of a phase shift mask, comprising the steps of:
   providing a Phase Shift Mask (PSM), said PSM having been provided with a pattern of phase shifter material over a second surface of said PSM, a pellicle having been provided over the surface of said pattern of phase shifter material;
   removing said pellicle from the surface of said pattern of phase shifter material;
   applying a first SC1 rinse to the surface of the mask;
   performing a first DIW rinse of the surface of the mask;
   applying a $H_2SO_4/H_2O_2$ rinse to the surface of the mask;
   performing a second DIW rinse of the surface of the mask;

applying a second SC1 rinse to the surface of the mask; and performing a second DIW rinse of the surface of the mask.

2. The method of claim 1, said first SC1 rinse comprising a mixture selected from the group of mixtures consisting of mixtures of $H_2O/NH_3/H_2O_2$ and $H_2O/NH_4OH/H_2O_2$.

3. The method of claim 2, wherein said mixture of $H_2O$ and $NH_3$ and $H_2O_2$ being in a volume ratio of $H_2O:NH_3:H_2O_2=1:x:y$, whereby the value of x varies between a numeric value of 1 and 0 while y varies between a numeric value of 0 and 1.

4. The method of claim 2, said mixture of $H_2O_2$ and $NH_4OH$ being in a volume ratio of $H_2O_2:NH_4OH=x:1$, whereby the value of x varies between a numeric value of about 1 and 50.

5. The method of claim 1, said second SC1 rinse comprising a mixture selected from the group of mixtures consisting of mixtures of $H_2O/NH_3/H_2O_2$ and $H_2O/NH_4OH/H_2O_2$.

6. The method of claim 5, said mixture of $H_2O$ and $NH_3$ and $H_2O_2$ being in a volume ratio of $H_2O:NH_3:H_2O_2=1:x:y$, whereby the value of x varies between a numeric value of 1 and 0 while y varies between a numeric value of 0 and 1.

7. The method of claim 5, said mixture of $H_2O_2$ and $NH_4OH$ being in a volume ratio of $H_2O_2:NH_4OH=x:1$, whereby the value of x varies between a numeric value of about 1 and 50.

8. The method of claim 1, with an additional step of re-mounting said pellicle over the surface of said pattern of phase shifter material.

9. The method of claim 1, said phase shifter material comprising MoSiON.

10. A method for cleaning the surface of a phase shift mask, comprising the steps of:

providing a Phase Shift Mask (PSM), said PSM having been provided with a pattern of phase shifter material over a second surface of said PSM, a pellicle having been provided over the surface of said pattern of phase shifter material;

removing said pellicle from the surface of said pattern of phase shifter material;

applying a first SC1 rinse to the surface of the mask, said first SC1 rinse comprising a mixture selected from the group of mixtures consisting of mixtures of $H_2O/NH_3/H_2O_2$ and $H_2O/NH_4OH/H_2O_2$;

performing a first DIW rinse of the surface of the mask;

applying a $H_2SO_4/H_2O_2$ rinse to the surface of the mask;

performing a second DIW rinse of the surface of the mask;

applying a second SC1 rinse to the surface of the mask, said second SC1 rinse comprising a mixture selected from the group of mixtures consisting of mixtures of $H_2O/NH_3/H_2O_2$ and $H_2O/NH_4OH/H_2O_2$; and performing a second DIW rinse of the surface of the mask.

11. The method of claim 10, said mixture of $H_2O$ and $NH_3$ and $H_2O_2$ being in a volume ratio of $H_2O:NH_3:H_2O_2=1:x:y$, whereby the value of x varies between a numeric value of 1 and 0 while y varies between a numeric value of 0 and 1.

12. The method of claim 10, said mixture of $H_2O_2$ and $NH_4OH$ being in a volume ratio of $H_2O_2:NH_4OH=x:1$, whereby the value of x varies between a numeric value of about 1 and 50.

13. The method of claim 10, with an additional step of re-mounting said pellicle over the surface of said pattern of phase shifter material.

14. The method of claim 10, said phase shifter material comprising MoSiON.

15. A method for cleaning the surface of a phase shift mask, comprising the steps of:

providing a Phase Shift Mask (PSM), said PSM having been provided with a pattern of phase shifter material over a second surface of said PSM, a pellicle having been provided over the surface of said pattern of phase shifter material;

removing said pellicle from the surface of said pattern of phase shifter material;

applying a first SC1 rinse to the surface of the mask, said first SC1 rinse comprising a mixture selected from the group of mixtures consisting of mixtures of $H_2O$ and $NH_3$ and $H_2O_2$ in the volume ratio of $H_2O:NH_3:H_2O_2=1:x:y$, whereby the value of x varies between a numeric value of 1 and 0 while y varies between a numeric value of 0 and 1 and mixtures of $H_2O_2$ and $NH_4OH$ being in a volume ratio of $H_2O_2:NH_4=x:1$, whereby the value of x varies between a numeric value of about 1 and 50;

performing a first DIW rinse of the surface of the mask;

applying a $H_2SO_4/H_2O_2$ rinse to the surface of the mask;

performing a second DIW rinse of the surface of the mask;

applying a second SC1 rinse to the surface of the mask, said second SC1 rinse comprising a mixture selected from the group of mixtures consisting of mixtures of $H_2O$ and $NH_3$ and $H_2O_2$ in the volume ratio of $H_2O:NH_3:H_2O_2=1:x:y$, whereby the value of x varies between a numeric value of 1 and 0 while y varies between a numeric value of 0 and 1 and mixtures of $H_2O_2$ and $NH_4$ being in a volume ratio of $H_2O_2:NH_4OH=x:1$, whereby the value of x varies between a numeric value of about 1 and 50; and performing a second DIW rinse of the surface of the mask.

16. The method of claim 15, with an additional step of re-mounting said pellicle over the surface of said pattern of phase shifter material.

17. The method of claim 15, said phase shifter material comprising MoSiON.

18. A method for cleaning the surface of a phase shift mask, comprising the steps of:

providing a Phase Shift Mask (PSM), said PSM having been provided with a pattern of phase shifter material over a second surface of said PSM, a pellicle having been provided over the surface of said pattern of phase shifter material;

removing said pellicle from the surface of said pattern of phase shifter material;

applying a first SC1 rinse to the surface of the mask, said first SC1 rinse comprising a mixture selected from the group of mixtures consisting of mixtures of $H_2O$ and $NH_3$ and $H_2O_2$ in the volume ratio of $H_2O:NH_3:H_2O_2=1:x:y$, whereby the value of x varies between a numeric value of 1 and 0 while y varies between a numeric value of 0 and 1 and mixtures of $H_2O_2$ and $NH_4OH$ being in a volume ratio of $H_2O_2:NH_4OH=x:1$, whereby the value of x varies between a numeric value of about 1 and 50;

performing a first DIW rinse of the surface of the mask;

applying a $H_2SO_4/H_2O_2$ rinse to the surface of the mask;

performing a second DIW rinse of the surface of the mask;

applying a second SC1 rinse to the surface of the mask, said second SC1 rinse comprising a mixture selected from the group of mixtures consisting of mixtures of $H_2O$ and $NH_3$ and $H_2O_2$ in the volume ratio of $H_2O:NH_3:H_2O_2=1:x:y$, whereby the value of x varies between a numeric value of 1 and 0 while y varies between a numeric value of 0 and 1 and mixtures of $H_2O_2$ and $NH_4OH$ being in a volume ratio of $H_2O_2:NH_4OH=x:1$, whereby the value of x varies between a numeric value of about 1 and 50;

performing a second DIW rinse of the surface of the mask; and re-mounting said pellicle over the surface of said pattern of phase shifter material.

19. The method of claim 18, said phase shifter material comprising MoSiON.

20. A method for cleaning the surface of a phase shift mask, comprising the steps of:

providing a Phase Shift Mask (PSM), said PSM having been provided with a pattern of phase shifter material over a second surface of said PSM, a pellicle having been provided over the surface of said pattern of phase shifter material, said phase shifter material comprising MoSiON;

removing said pellicle from the surface of said pattern of phase shifter material;

applying a first SC1 rinse to the surface of the mask, said first SC1 rinse comprising a mixture selected from the group of mixtures consisting of mixtures of $H_2O$ and $NH_3$ and $H_2O_2$ in the volume ratio of $H_2O:NH_3:H_2O_2=$ 1:x:y, whereby the value of x varies between a numeric value of 1 and 0 while y varies between a numeric value of 0 and 1 and mixtures of $H_2O_2$ and $NH_4OH$ being in a volume ratio of $H_2O_2:NH_4OH=x:1$, whereby the value of x varies between a numeric value of about 1 and 50;

performing a first DIW rinse of the surface of the mask;

applying a $H_2SO_4/H_2O_2$ rinse to the surface of the mask;

performing a second DIW rinse of the surface of the mask;

applying a second SC1 rinse to the surface of the mask, said second SC1 rinse comprising a mixture selected from the group of mixtures consisting of mixtures of $H_2O$ and $NH_3$ and $H_2O_2$ in the volume ratio of $H_2O:NH_3:H_2O_2=1:x:y$, whereby the value of x varies between a numeric value of 1 and 0 while y varies between a numeric value of 0 and 1 and mixtures of $H_2O_2$ and $NH_4OH$ being in a volume ratio of $H_2O_2$ $NH_4OH=x:1$, whereby the value of x varies between a numeric value of about 1 and 50;

performing a second DIW rinse of the surface of the mask; and re-mounting said pellicle over the surface of said pattern of phase shifter material.

21. A method for repairing a phase shift mask, comprising the steps of:

providing a Phase Shift Mask (PSM), said PSM having been provided with a pattern of phase shifter material over a second surface of said PSM, a pellicle having been provided over the surface of said pattern of phase shifter material;

removing said pellicle from the surface of said pattern of phase shifter material;

performing repairs of said pattern of phase shifter material provided over a second surface of said PSM;

applying a first SC1 rinse to the surface of the mask;

performing a first DIW rinse of the surface of the mask;

applying a $H_2SO_4/H_2O_2$ rinse to the surface of the mask;

performing a second DIW rinse of the surface of the mask;

applying a second SC1 rinse to the surface of the mask; and performing a second DIW rinse of the surface of the mask.

22. The method of claim 21, said first SC1 rinse comprising a mixture selected from the group of mixtures consisting of mixtures of $H_2O/NH_3/H_2O_2$ and $H_2O/NH_4OH/H_2O_2$.

23. The method of claim 22, wherein said mixture of $H_2O$ and $NH_3$ and $H_2O_2$ being in a volume ratio of $H_2O:NH_3:H_2O_2=1$ x:y, whereby the value of x varies between a numeric value of 1 and 0 while y varies between a numeric value of 0 and 1.

24. The method of claim 22, said mixture of $H_2O_2$ and $NH_4OH$ being in a volume ratio of $H_2O_2:NH_4OH=x:1$, whereby the value of x varies between a numeric value of about 1 and 50.

25. The method of claim 21, said second SC1 rinse comprising a mixture selected from the group of mixtures consisting of mixtures of $H_2O/NH_3/H_2O_2$ and $H_2O/NH_4OH/H_2O_2$.

26. The method of claim 25, said mixture of $H_2O$ and $NH_3$ and $H_2O_2$ being in a volume ratio of $H_2O:NH_3:H_2O_2:x:y$, whereby the value of x varies between a numeric value of 1 and 0 while y varies between a numeric value of 0 and 1.

27. The method of claim 25, said mixture of $H_2O_2$ and $NH_4OH$ being in a volume ratio of $H_2O_2:NH_4OH=x:1$, whereby the value of x varies between a numeric value of about 1 and 50.

28. The method of claim 21, with an additional step of re-mounting said pellicle over the surface of said pattern of phase shifter material.

29. The method of claim 21, said phase shifter material comprising MoSiON.

30. A method for repairing a phase shift mask, comprising the steps of:

providing a Phase Shift Mask (PSM), said PSM having been provided with a pattern of phase shifter material over a second surface of said PSM, a pellicle having been provided over the surface of said pattern of phase shifter material;

removing said pellicle from the surface of said pattern of phase shifter material;

performing repairs of said pattern of phase shifter material provided over a second surface of said PSM;

applying a first SC1 rinse to the surface of the mask, said first SC1 rinse comprising a mixture selected from the group of mixtures consisting of mixtures of $H_2O$ and $NH_3$ and $H_2O_2$ and mixtures of $H_2O_2$ and $NH_4OH$ being in a volume ratio of $H_2O_2:NH_4OH$ x:1, whereby the value of x varies between a numeric value of about 1 and 50;

performing a first DIW rinse of the surface of the mask;

applying a $H_2SO_4/H_2O_2$ rinse to the surface of the mask;

performing a second DIW rinse of the surface of the mask;

applying a second SC1 rinse to the surface of the mask, said second SC1 rinse comprising a mixture selected from the group of mixtures consisting of mixtures of $H_2O$ and $NH_3$ and $H_2O_2$ and mixtures of $H_2O_2$ and $NH_4OH$ being in a volume ratio of $H_2O_2$ $NH_4OH=x:1$, whereby the value of x varies between a numeric value of about 1 and 50; and performing a second DIW rinse of the surface of the mask.

31. The method of claim 30, wherein said first SC1 mixture of $H_2O$ and $NH_3$ and $H_2O_2$ is in the ratio of $H_2O:NH_3:H_2O_2=1:x:y$, whereby the value of x varies between a numeric value of 1 and 0 while y varies between a numeric value of 0 and 1.

32. The method of claim 30, with an additional step of re-mounting said pellicle over the surface of said pattern of phase shifter material.

33. The method of claim 30, said phase shifter material comprising MoSiON.

* * * * *